United States Patent
Miller et al.

(10) Patent No.: US 6,200,074 B1
(45) Date of Patent: Mar. 13, 2001

(54) METHOD FOR DRILLING CIRCUIT BOARDS

(76) Inventors: James J. Miller, 127 Dalewood Pl., Brea, CA (US) 92821; Paul E. Dinneweth, 4331 Stone Mountain Rd., Chino Hills, CA (US) 91709; Hans Vandervelde, 9372 Twin Mountain Cir., San Diego, CA (US) 92126; James T. Hegeduis, 24672 Ashland Dr., Laguna Hills, CA (US) 92653

( * ) Notice: Subject to any disclaimer, the term of this patent is extended or adjusted under 35 U.S.C. 154(b) by 0 days.

(21) Appl. No.: 09/287,811

(22) Filed: Apr. 7, 1999

(51) Int. Cl.[7] .............................. B23B 35/00; B23B 41/14
(52) U.S. Cl. .............................. 408/1 R; 408/87; 408/95
(58) Field of Search .................. 408/1 R, 87, 95

(56) References Cited

U.S. PATENT DOCUMENTS

| | | | |
|---|---|---|---|
| 3,700,341 | * 10/1972 | Block | 408/1 R |
| 4,269,549 | * 5/1981 | Blcok | 408/1 R |
| 4,311,419 | * 1/1982 | Block | 408/1 R |
| 4,781,495 | 11/1988 | Hatch . | |
| 5,082,402 | * 1/1992 | Gaku et al. | 408/1 R |
| 5,507,603 | * 4/1996 | Nakano et al. | 408/1 R |
| 5,524,885 | * 6/1996 | Heo | 473/299 |
| 6,000,886 | * 12/1999 | Wahio et al. | 408/1 R |

FOREIGN PATENT DOCUMENTS

| | | | |
|---|---|---|---|
| 642297 A1 | 5/1994 | (EP) . | |
| 2252522 | * 8/1992 | (GB) | 408/1 R |
| 9214346 | 8/1992 | (WO) . | |

* cited by examiner

*Primary Examiner*—Steven C. Bishop
(74) *Attorney, Agent, or Firm*—Kilpatrick Stockton LLP

(57) ABSTRACT

A method and materials for drilling through-holes in printed circuit boards with a drilling tool is disclosed. The method involves the use of a lubricating entry material placed on the top surface of a stack of printed circuit boards and a lubricating backup board placed beneath the bottom surface of the stack of printed circuit boards. The lubricating entry material has a core with skins attached on both sides by a lubricant/adhesive. Similarly, the backup board has a core with skins attached on both sides by a lubricant/adhesive. The skins are hard enough to support the top and bottom surfaces of the printed circuit boards and thereby reduce burring at the entry point and exit point of the through-hole. The lubricant/adhesive coats the drilling tool during the drilling operation to reduce friction and thereby reduce the temperature of the drilling tool.

33 Claims, 2 Drawing Sheets

METHOD FOR DRILLING CIRCUIT BOARDS

FIELD OF THE INVENTION

This invention relates to drilling through-holes in printed circuit boards, and more particularly to the use of entry materials and backup boards in drilling through-holes in printed circuit boards.

BACKGROUND OF THE INVENTION

Multi-layer printed circuit boards typically include, in cross-section, a copper outer layer, followed by an epoxy-glass resin layer, a copper inner layer, another epoxy-glass resin layer, and an outer copper layer. The number of alternating copper inner layers and epoxy-glass resin layers can vary. In some printed circuit boards, the copper inner layer may not be used. In other printed circuit boards, the dielectric layer may be made from a material other than epoxy-glass resin.

Multi-layer printed circuit boards are made by a multi-stage process. Once the circuit pattern is etched onto each copper inner layer, the inner layer or layers are sandwiched between the epoxy layers and the copper outer layers, and heat and pressure are then applied to cure the epoxy and bond the layers together. A large number of small through-holes are then drilled through the cross-section of the multi-layer printed circuit board by a high speed drilling tool, in preparation for forming electrical contacts between the top and bottom outer copper layers and the inner copper layers of the printed circuit board. Usually, the contacts are made by first plating an electrically conductive metal, such as electroless copper, to the surface of the through-hole. The wall of the through-hole is then further plated with electrolytic copper to complete the contact between the copper layers of the printed circuit board.

It is not uncommon to drill thousands of through-holes in a single printed circuit board. As a result, abrasion to the drill bit is a problem because of the high drilling speed and the large amount of heat generated, especially because of drilling through the metal layers and the abrasive epoxy-glass layers. In conventional drilling operations, the drilling tool can easily reach temperatures in the neighborhood of 500.degrees. F. to 700.degrees. F.

Such drilling temperatures encountered during the drilling of through-holes in the epoxy-glass and copper layers often causes the epoxy to smear over the copper inner layers. The dielectric material also can smear onto the conductive layers when drilling panels having insulating layers made from other materials. If the through-holes are left untreated (i.e., if the smeared dielectric material is not completely removed) prior to copper plating the walls of the through-holes, a dielectric barrier can be left between the conductive path of the copper plated through-holes and the copper conductive layers. This interferes with the electrical connection and results in unreliable electrical contacts between the copper inner and outer layers (or between the conductive outer layers if an inner layer is not used). The high drilling temperatures also shortens the useful life of the drill bit.

Another problem often encountered during the high speed drilling of printed circuit boards is the creation of a burr on the periphery of the through-hole where the drill exits the copper-clad outer surface. Such a burr may form a dam-like condition during plating of the through-hole which can entrap contaminants or air. Such entrapped contaminants or air may later result in cracking of the through-hole plating and a resultant electrical failure. Such burrs thus must be removed, either by a separate sanding operation or prevented by the use of a suitable backup board. Suitable backup boards, for example are disclosed in Block U.S. Pat. Nos. 3,700,341 and 4,269,549.

Yet another problem is countered when the drilling tool enters the printed circuit board. The high speed drill bit upon encountering the surface of the printed circuit board tends to create burrs at the entry point of the through-hole. Conventionally, the problem of burrs at the entry point of the through-hole is reduced by the use of an appropriate entry material. Typically, the entry material used is a thin metal foil, such as aluminum.

The prior art methods of drilling printed circuit boards fail to adequately address the three identified problems in an integrated fashion. For example, Hatch et al. U.S. Pat. Nos. 4,781,495 and 4,929,370 disclose a drilling method in which a lubricating sheet is placed between each printed board in a stack of printed circuit boards prior to drilling through-holes in the printed circuit boars. Each sheet consists of a porous, pulp-based paper which is saturated with a water soluble dry lubricant. While the lubricating sheet provides lubrication for the drilling tool during the drilling process, the porous, pulp-based paper does not contribute to the elimination or reduction of burrs. Moreover, because the outer surface of the lubricating sheet is coated with a layer of the lubricant, the lubricant directly contacts the surface of the printed circuit board and consequently contaminates the printed circuit board so that a subsequent cleaning step is required.

Another prior art entry material consists of a thin aluminum foil with a lubricating film coated on one surface. The entry material is placed on the top surface of the stack of printed circuit boards to be drilled with the aluminum foil in contact with the top surface of the stack of printed circuit boards. While such an entry material provides lubrication to the drilling tools, the thin aluminum foil lacks dimensional stability in that it bows and twists. Such bowing and twisting results in lost of contact between the top surface of the printed circuit board and the aluminum foil. Without such contact, the entry material cannot perform the function of reducing burring.

SUMMARY OF THE INVENTION

The present invention includes methods and materials for use in drilling printed circuit boards. The method for drilling printed circuit boards of the present invention provides an integrated approach to solving the problems of excessive heat and burring described above. In one embodiment of the method of the present invention, a lubricating, dimensionally stable entry material is placed on top of a stack of printed circuit boards and a lubricating, dimensionally stable backup board is placed beneath the stack of printed circuit boards. During drilling, the lubricating entry material and the lubricating backup board serve to lubricate the drill bit and thereby reduce drilling temperatures and extend the life of the drill bit. The dimensionally stable lubricating entry material and dimensionally stable lubricating backup board also support the top and bottom surfaces of the printed circuit board and thereby serve to reduce burrs.

In another embodiment of the method of the present invention where top surface burring is not a serious concern, the lubricating backup board is used alone without the lubricating entry material. Because the drill bit penetrates the lubricating backup board at the end of the first pass through the stack of printed circuit boards, the drill bit retains sufficient lubricant for withdrawal and for the subsequent pass through stacks of printed circuit boards.

The materials of the present invention include entry materials and backup boards. In one embodiment of the present invention, the entry material comprises a cellulose core and an outer skin on both faces of the cellulose core. The outer skins are bonded to the cellulose core by layers of lubricant/adhesive. The cellulose core consists of consolidated cellulose fibers. The cellulose core has limited porosity to the lubricant/adhesive and is not impregnated or saturated by the lubricant/adhesive. In another embodiment of the entry material, the cellulose core may be eliminated, and the outer skins may be bonded directly to each other by means of a layer of the lubricant/adhesive. The laminated construction of the entry materials assures dimensional stability both with respect to bowing and twisting.

The layer of lubricant/adhesive consists of a water dispersion of polyethylene oxide resin plasticized with a high molecular weight polyethylene glycol. The lubricant/adhesive layer is formed by coating either the outer skin or directly coating the cellulose core and then drying the solution to form the lubricant/adhesive film for lamination.

The outer skin of the entry material may include metal foil, epoxy coated paper, uncoated paper, or plastic. The outer skin serves several functions. The outer skin of the entry material keeps the lubricant/adhesive from directly contacting the top surface of the circuit board which reduces surface contamination of the circuit board during drilling. The outer skin eliminates the need for slip sheets between successively stacked sheets of the entry material to isolate the lubricant/adhesive on adjacent sheets of entry material during the manufacturing, storing, and shipping of the entry material. The outer skin also serves the purpose of burr prevention/reduction by providing a hard, dimensionally stable surface to support the top surface of the circuit board during the entry of the drill bit. The outer skin, however, has sufficient resilience so that when initially "hit" by the drill bit, the outer skin dents to absorb the shock of the drill bit and to center the drill bit at the point of impact.

One embodiment of the backup board of the present invention comprises a pressed wood core and an outer skin on both faces of the wood core. The outer skins are bonded to the wood core by layers of lubricant/adhesive. The wood core consists of a pressed wood fiber board. The pressed wood fiber board is not porous, i.e. the lubricant/adhesive does not penetrate appreciably into and does not saturate the wood fiber board. The lubricant/adhesive is a same as the lubricant/adhesive used with the entry material.

The outer skin of the wood core backup board may include metal foil, epoxy coated paper, uncoated paper, or plastic. The outer skin of the wood core backup board serves several functions. The outer skin keeps the lubricant/adhesive from directly contacting the bottom surface of the circuit board which reduces surface contamination of the circuit board. The outer skin eliminates the need for slip sheets to isolate the lubricant/adhesive between successively stacked backup boards in the manufacturing, storing, and shipping of the wood core backup boards. The outer skin serves the purpose of burr prevention/reduction by providing a hard, dimensionally stable surface to support the bottom surface of the stack of circuit boards.

A second embodiment of the backup board of the present invention comprises a ventilated backup board. The ventilated backup board is used in the method of the present invention and comprises a sinuous core member having opposing antinode portions of metallic foil sandwiched between opposing metallic foil sheets. One of the antinode portions faces against one of such foil sheets and the other antinode portions faces against the other of the foil sheets. The antinode portions are preferably elongated running in substantially parallel lines between opposite edges of the foil sheets so as to form elongated channels therebetween and may be approximately in the form of a sine wave. The pair of opposing metallic foil sheets may be of copper or steel but are preferably of aluminum. The sinuous core may likewise be foil sheets of copper or steel but are preferably of aluminum. A layer of adhesive bonds each of the aluminum foil sheets to the top and bottom of the sinuous core member. An outer skin is bonded to each of the aluminum foil sheets by a layer of lubricant/adhesive. The outer skins of the ventilated backup board may include metal foil, epoxy coated paper, uncoated paper, or plastic. The outer skins of the ventilated backup board serve several functions. The outer skins keep the lubricant from directly contacting the bottom surface of the circuit board which reduces surface contamination. The outer skins eliminate the need for slip sheets in the manufacturing, storing, and shipping of the ventilated backup boards. The outer skins serve the purpose of burr prevention/reduction by providing a hard, dimensionally stable surface to support the bottom of the circuit board. The layer of lubricant/adhesive is a same as the layer of lubricant/adhesive used with the entry material and the wood core backup board.

In connection with the method of the present invention for drilling through-holes in printed circuit boards, the entry material is placed on the top surface of the circuit board or stack of circuit boards to be drilled, and the backup board is placed on a support surface beneath the bottom surface of the stack of circuit boards to be drilled. The top surface of the circuit board or stack of circuit boards abuts against the outer skin of the entry material, and the bottom surface of the circuit board or stack of circuit boards abuts against the outer skin of the backup board. The stack is then pressed down by a pressure foot prior to drilling to assure that the stack is flat and secure when the drill bit makes its initial contact with the entry material. During the drilling, the drill bit passes through the first outer skin of the entry material, through the first layer of lubricant/adhesive, through the cellulose core (if present), through the second layer of lubricant/adhesive, and through the second outer skin of the entry material. The drill bit then passes through the stack of printed circuit boards and into the backup board. In the case of the wood core backup board, the drill bit passes through the outer skin of the backup board, through the layer of lubricant/adhesive, and into the wood core of the backup board. In the case of the ventilated backup board, the drill bit passes through the outer skin, through the lubricant/adhesive, through the aluminum sheet, through the core lamination adhesive, and into the ventilated core of the backup board. After the drill bit enters the core space, the drill bit goes no further and momentarily dwells in the core of the backup board. For the ventilated backup board, air flow is provided in the core of the backup board to facilitate the removal of cuttings therefrom and to aid in the cooling of the drill bit. As the drill bit passes through the layer of lubricant/adhesive of the backup boards, the drill bit picks up lubricant from the layer of lubricant/adhesive. The lubricant remains on the drill bit and reduces the friction as the drill bit is withdrawn from the through-hole and reduces friction as the drill bit drills the next through-hole.

It is therefore the object of this invention to provide a method for drilling printed circuit boards which reduces the temperature of the drill bit and thereby extends the life of the drill bit and reduces the smearing of the dielectric material in the through-hole of the printed circuit board.

It is a further object of the present invention to provide a method for drilling printed circuit boards which reduces burring both at the entry point of the through-hole and at the exit point of the throughhole.

It is also an object of the present invention to provide an entry material for use in drilling printed boards, which entry material reduces the temperature of the drill bit and also reduces burring around the entry point of the through-hole.

It is likewise an object of the present invention to provide a backup board for use in drilling printed boards, which backup board reduces the temperature of the drill bit and also reduces burring around the exit point of the through-hole.

BRIEF DESCRIPTION OF THE DRAWINGS

Other objects of the invention will become apparent as the description proceeds in connection with the accompanying drawings of which.

DETAILED DESCRIPTION OF THE INVENTION

Figure 1:
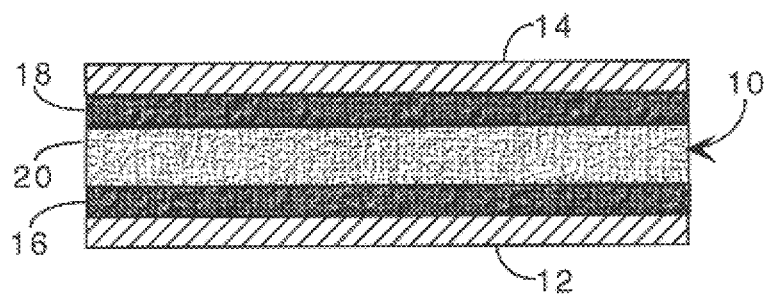
FIG. 1 is a cross-sectional view of a lubricating entry material.
Figure 4:
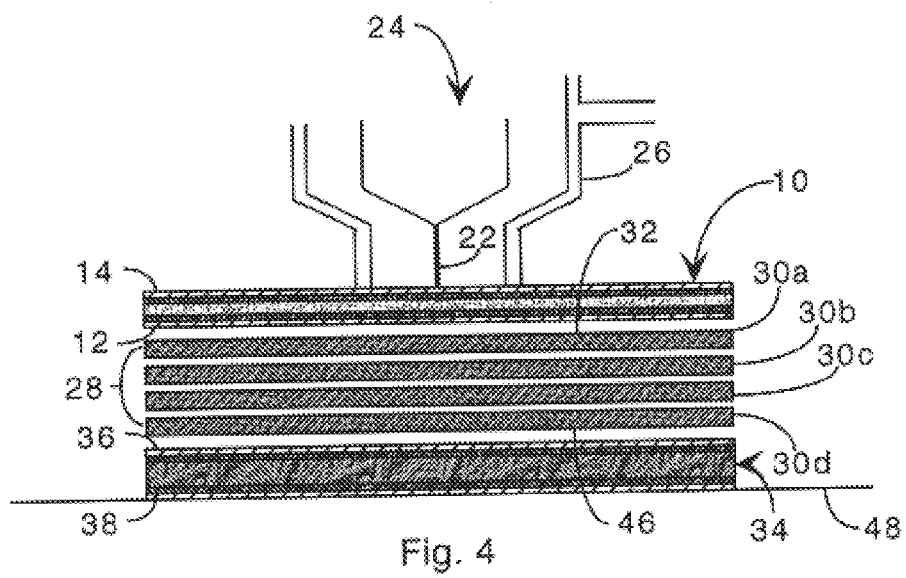
FIG. 4 is a cross-sectional view illustrating one method for drilling printed circuit boards using a lubricating entry material and a lubricating backup board.

Referring to FIGS. 1 and 4, there is shown an embodiment of a lubricating entry material 10 used in connection with drilling through-holes in a stack 28 of printed circuit boards 30a, 30b, 30c, and 30d. The lubricating entry material 10 comprises of first hard outer entry skin 12, a second hard outer entry skin 14, a first lubricant/adhesive layer 16, a second lubricant/adhesive layer 18, and a core 20. The hard outer entry skins 12 and 14 are bonded to the core 20 by means of the lubricant/adhesive layers 16 and 18.

The core 20 may consist of consolidated, randomly oriented cellulose fibers. Other suitable materials for the core 20 may include solid resin films including polyester films. The cellulose core 20 typically has a thickness of from about 3 mils to about 8 mils. The cellulose core 20 has limited porosity to the lubricant/adhesive of the lubricant/adhesive layers 16 and 18. The cellulose core 20 is not impregnated or saturated by the lubricant/adhesive. Instead, the cellulose core 20 only absorbs enough lubricant/adhesive to insure a bond between the lubricant/adhesive layers 16 and 18 and the cellulose core 20. The cellulose core 20 is resilient and thereby functions as a cushion against the impact of the drill bit 22 of a high speed drilling tool 24 (FIG. 4) when the entry material 10 is "hit" by the drill bit 22 during the drilling of through-holes in a printed circuit boards 30a, 30b, 30c, and 30d.

Alternatively, the core 20 may be eliminated from the laminated structure of the entry material 10 where cushioning requirements are reduced. In that alternative embodiment without the core 20, the hard outer entry skins 12 and 14 are bonded directly to each other by a layer of lubricant/adhesive.

Each of the layers 16 and 18 of lubricant/adhesive consists of a water dispersion of polyethylene oxide resin plasticized with a high molecular weight polyethylene glycol. The lubricant/adhesive layers 16 and 18 are formed by coating either the outer skins 12 and 14 or directly coating the cellulose core 20 and then drying the solution to form the lubricant/adhesive film for lamination. The resulting lubricant/adhesive layers 16 and 18 are typically from about 3 mils to about 7 mils in thickness. The dried lubricant/adhesive layers 16 and 18 have a softening point of less than 250° F. so that during drilling of the through-holes in the printed circuit boards, the lubricant/adhesive layers 16 and 18 can transfer lubricant to the drill bit 22.

Each of the outer skins 12 and 14 of the entry material 10 may consist of metal foil, epoxy coated paper, uncoated paper, or plastic. Each of the hard outer skins has a hardness, the value of which depends on the material used and which combined with the lubricant/adhesive is sufficient to suppress entry burring on the top printed circuit board 30a. For example, the aluminum used for the outer skins 12 and 14 may be type 3003-H19 aluminum foil having a thickness from about 0.001 inch to about 0.002 inch.

The outer skins 12 and 14 serve several functions. The outer skin 12, which is in contact with the top surface 32 of the stack 28 of printed circuit boards 30a, 30b, 30c, and 30d during drilling (FIG. 4), keeps the lubricant/adhesive layer 16 from directly contacting the top surface 32 of the stack 28 and thereby eliminates surface contamination of the circuit boards during drilling. The outer skin 14, which is in contact with the pressure foot 26 during drilling (FIG. 4), keeps the pressure foot 26 of the drilling machine 24 from contacting the lubricant/adhesive layer 18 and thereby eliminates build up of lubricant on the pressure foot 26 of the drilling machine 24. The outer skins 12 and 14 also eliminate the need for slip sheets between successively stacked sheets of the entry material 10 by isolating the lubricant/adhesive layers 16 and 18 on adjacent sheets of entry material 10 during the manufacturing, storing, and shipping of the entry material 10. The outer skin 12, which is in contact with the top surface 32 of a stack 28 of printed circuit boards 30a, 30b, 30c, and 30d (FIG. 4), also serves the purpose of burr prevention/reduction by providing a hard, dimensionally stable outer surface to support the top surface 32 of the circuit board 30a during the entry of the drill bit 22. The outer skin 14, however, has sufficient resilience so that when the outer skin 14 is initially "hit" by the drill bit 22, the outer skin 14 in cooperation with the core 20 dents to absorb the shock of the drill bit 22 and to center the drill bit at the point of impact.

With or without the core 20, the laminated construction of the lubricating entry material 10 gives the lubricating entry material 10 dimensional stability both with respect to bowing and twisting. Typically the dimensional stability exhibited by the entry material 10 of the present invention is less that 2% bow and twist for the entry material 10 with a cellulose core 20 and is less that 2% bow and twist for the entry material 10 without the cellulose core 20.

Figure 2:
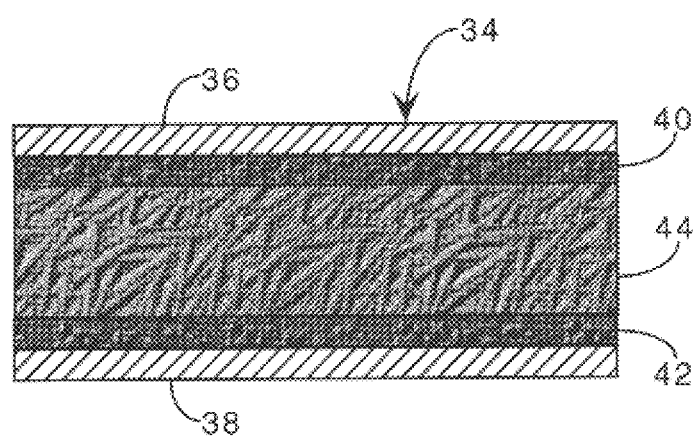
FIG. 2 is a cross-sectional view of one embodiment of a lubricating backup board.

Referring to FIGS. 2 and 4, there is shown an embodiment of a lubricating backup board 34 used in connection with drilling through-holes in a stack 28 of printed circuit boards 30a, 30b, 30c, and 30d. The backup board 34 comprises a first hard outer backup skin 36, a second hard outer backup skin 38, a first lubricant/adhesive layer 40, a second lubricant/adhesive layer 42, and a solid core 44. The hard outer backup skins 36 and 38 are bonded to the solid core 44 by means of the lubricant/adhesive layers 40 and 42.

The core 44 may consist of pressed wood fiber board. Other suitable materials for the core 44 may include solid resin and paper-resin blends. The wood core 44 typically has a thickness from about 0.050 inch to about 0.125 inch. The wood core 44 has limited porosity to the lubricant/adhesive and is not impregnated or saturated by the lubricant/adhesive. Instead, the wood core 44 only absorbs enough lubricant/adhesive at the surface to ensure a bond between the lubricant/adhesive layers 40 and 42 and the wood core 44.

Each of the layers 40 and 43 of lubricant/adhesive consists of the same water dispersion of polyethylene oxide resin plasticized with a high molecular weight polyethylene glycol as previously described in connection with lubricant/adhesive layers 16 and 18 of the entry material 10. Likewise, the lubricant/adhesive layers 40 and 42 are formed by coating either the outer skins 36 and 38 or directly coating the wood core 44 and then drying the solution to form the lubricant/adhesive for lamination. The resulting lubricant/adhesive layers 40 and 42 are typically from about 3 mils to about 7 mils in thickness. Generally the dried lubricant/adhesive layers 40 and 42 have a softening point of less than 250° F. so that during drilling of the through-holes in the printed circuit boards, the lubricant/adhesive layers 40 and 42 can transfer lubricant to the drill bit 22.

Each of the outer skins 36 and 38 of the entry material 10 may consist of metal foil, epoxy coated paper, uncoated paper, or plastic. Each of the hard outer skins has a hardness, the value of which depends on the material used and which combined with the lubricant/adhesive is sufficient to suppress entry burring on the top printed circuit board 30a. For example, the aluminum used for the outer skins 12 and 14 may be type 3003-H19 aluminum foil having a thickness of about 0.005.

The outer skins 36 and 38 of the wood core backup board 34 serves several functions. The outer skin 36, which is in contact with the bottom surface 46 of the stack 28 of printed circuit boards 30a, 30b, 30c, and 30d during drilling (FIG. 4), keeps the lubricant/adhesive layer 40 from directly contacting the bottom surface 46 and thereby eliminates surface contamination of the circuit board 30d during drilling. The outer skin 38, which is in contact with a support surface 48 during drilling (FIG. 4), keeps lubricant/adhesive from building up on the support surface 48. The outer skins 36 and 38 of the wood core backup board 34 also eliminate the need for slip sheets between successively stacked backup boards 34 for isolating the lubricant/adhesive layers 40 and 42 on adjacent backup boards 34 during the manufacturing, storing, and shipping of the backup boards 34. The outer skin 36, which is in contact with the bottom surface 46 of the stacked 28 of printed circuit boards 30a, 30b, 30c, and 30d during drilling (FIG. 4), also serves the purpose of burr prevention/reduction by providing a hard, dimensionally stable surface to support the bottom surface 46 of circuit board 30d (FIG. 4) during the drilling process.

The laminated construction of the wood core backup board 34 gives the backup board 34 dimensional stability both respect to bowing and twisting. Typically the dimensional stability exhibited by the backup board 34 of the present invention is less that 2% bow and twist.

Figure 3:
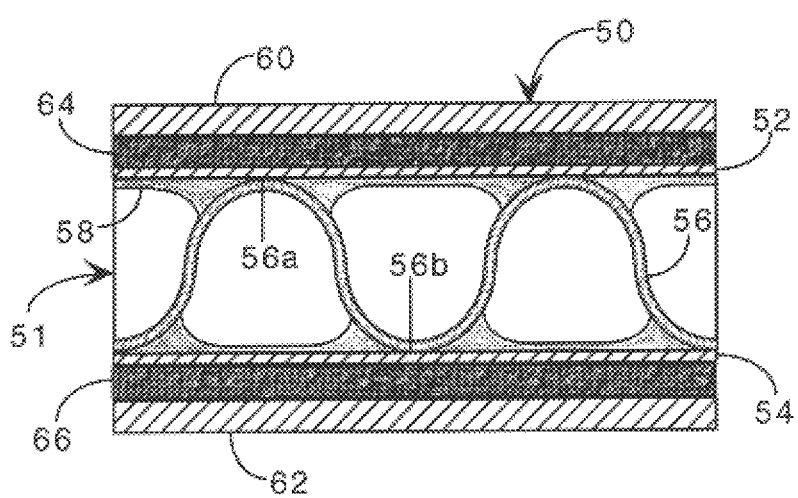
FIG. 3 is a cross-sectional view of another embodiment of a lubricating backup board.
Figure 5:
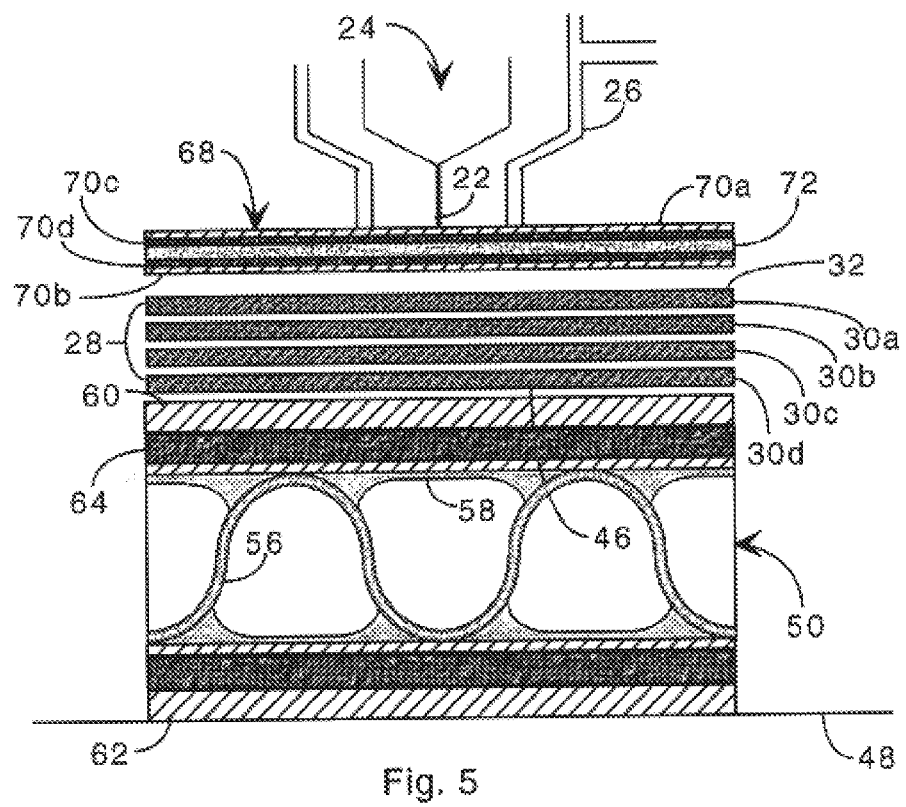
FIG. 5 is a cross-sectional view illustrating another method for drilling printed circuit boards using a conventional entry material and a lubricating backup board.

Referring now to FIGS. 3 and 5, there is shown another embodiment of a lubricating backup board 50 used in connection with drilling through-holes in a stack 28 of printed circuit boards 30a, 30b, 30c, and 30d. The backup board 50 comprises a first hard outer backup skin 60, a second hard outer backup skin 62, a first lubricant/adhesive layer 64, a second lubricant/adhesive layer 66, and a ventilated core 51 comprising an upper metallic foil sheet 52, a lower metallic foil sheet 54, and a sinuous core member 56. The hard outer backup skins 60 and 62 are bonded to the metallic foil sheets 52 and 54 of the ventilated core 51 by means of the lubricant/adhesive layers 64 and 66.

The sinusoidally undulating core member 56 is sandwiched between the upper metallic foil sheet 52 and the lower metallic foil sheet 54 to form the ventilated core 51 for the backup board 50. The core member 56 has opposing antinode portions 56a and 56b which face against the inside surfaces of sheets 52 and 54 respectively. Antinodal portions 56a and 56b are bonded to sheets 52 and 54 by means of a suitable bonding material 58 and run between opposite edges of the sheets, the apices of these nodal portions abutting against the sheets and running in substantially parallel lines. The pair of opposing metallic foil sheets 52 and 54 may be of copper or steel but are preferably of aluminum. The sinuous core member 56 may likewise be foil sheets of copper or steel but are preferably of aluminum. It has been found that aluminum foil is particularly suitable for sheets 52 and 54 and core member 56.

In one embodiment of the core 51 of the ventilated backup board 50 is constructed of type 3003-H19 aluminum foil having a thickness of about 0.005 inch for the upper and lower foil sheets 52 and 54 and a thickness of about 0.002 inch for the sinuous core member 56. When using aluminum of this type with 0.005 inch thickness, the spacing between the inner walls of the two foil sheets 52 and 54 should typically be approximately 0.053 inch. In another embodiment of the core 51 of the backup board 50, the upper and lower foil sheets 52 and 54 have a thickness of about 0.007 inch, the core member 56 has a thickness of about 0.002 inch, and the spacing between the inner walls of the two foil sheets should be approximately 0.079 inch. In yet another embodiment of the core 51 of the backup board 50, the upper and lower foil sheets 52 and 54 have a thickness of about 0.009 inch, the core member 56 has a thickness of about 0.002 inch, and the spacing between the inner walls of the two foil sheets 52 and 54 should be approximately 0.106 inch.

Each of the layers 64 and 66 of lubricant/adhesive consists of the same water dispersion of polyethylene oxide resin plasticized with a high molecular weight polyethylene glycol as previously described in connection with lubricant/adhesive layers 16 and 18 of the entry material 10 and lubricant/adhesive layers 40 and 42 of the wood core backup board 34. Likewise, the lubricant/adhesive layers 64 and 66 are formed by coating either the outer skins 60 and 62 or directly coating the foil sheets 52 and 54 and then drying the solution to form the lubricant/adhesive for lamination. The resulting lubricant/adhesive layers 64 and 66 are typically from about 3 mils to about 7 mils in thickness. Generally the dried lubricant/adhesive layers 64 and 66 have a softening point of less than 250° F. so that during drilling of the through-holes in the printed circuit boards, the lubricant/adhesive layers 64 and 66 can transfer lubricant to the drill bit 22 (FIG. 5).

Each of the outer skins 60 and 62 of the entry material 10 may consist of metal foil, epoxy coated paper, uncoated paper, or plastic. Each of the hard outer skins has a hardness, the value of which depends on the material used and which combined with the lubricant/adhesive is sufficient to suppress entry burring on the top printed circuit board 30a. The aluminum used for the outer skins 60 and 62 may be type 3003-H19 aluminum foil having a thickness of about 0.005 inch. This type of aluminum has the following constituents added to pure aluminum: silicon—6%; iron—7%; copper—0.05–0.20%; manganese—1.0–1.5%; and zinc—0.10%.

The outer skins 60 and 62 of the ventilated core backup board 50 serves several functions. The outer skin 60, which is in contact with the bottom surface 46 of the stack 28 of printed circuit boards 30a, 30b, 30c, and 30d during drilling (FIG. 5), keeps the lubricant/adhesive layer 64 from directly contacting the bottom surface 46 and thereby eliminates surface contamination of the circuit board 30d during drilling. The outer skin 62, which is in contact with a support surface 48 during drilling (FIG. 5), keeps lubricant/adhesive from building up on the support surface 48. The outer skins 60 and 62 of the ventilated core backup board 50 also eliminate the need for slip sheets between successively stacked backup boards 50 to isolate the lubricant/adhesive layers 64 and 66 on adjacent backup boards 50 during the manufacturing, storing, and shipping of the backup boards 50. The outer skin 60, which is in contact with the bottom surface 46 of the stack 28 of printed circuit boards 30a, 30b, 30c, and 30d during drilling (FIG. 5) also serves the purpose of burr prevention/reduction by providing a hard, dimensionally stable surface to support the bottom surface 46 of circuit board 30d (FIG. 5) during the drilling process.

The laminated construction of the ventilated core backup board 50 gives the backup board 50 dimensional stability both respect to bowing and twisting. Typically the dimensional stability exhibited by the backup board 50 of the present invention is less than 1% bow and twist.

Referring now to FIG. 4, the operation of a method in accordance with the present invention for drilling through-holes in printed circuit boards 30a, 30b, 30c, and 30d is schematically illustrated. A lubricating backup board such as the backup board 34 is placed on support surface 48. A stack 28 of circuit boards 30a, 30b, 30c, and 30d is placed on the lubricating backup board 34 so that the bottom surface 46 of the stack 28 abuts the hard outer backup skin 36 of the backup board 34. It should be understood that the lubricating backup board 50 could be used instead of the lubricating backup board 34 as shown in FIG. 4.

The lubricating entry material 10 is placed on the top surface 32 of the stack 28 of circuit boards 30a, 30b, 30c, and 30d to be drilled. The top surface 32 of the stack 28 of circuit boards 30a, 30b, 30c, and 30d abuts against the hard outer skin 12 of the entry material 10. The stack 28, of course, may include more or less printed circuit boards than the four illustrated in FIG. 4. The exaggerated spacing between the backup board 34, the circuit boards 30a, 30b, 30c, and 30d, and the entry material 10 is shown in FIG. 4 for purpose of clarity whereas in reality all of the components would be in tight, intimate contact with each other.

Once the backup board 34, the stack 28, and the entry material 10 have been positioned as shown in FIG. 4, the stack is then pressed down by a pressure foot 26 prior to drilling to assure that the stack is flat and secure when the drill bit 22 makes its initial contact with the entry material 10. During the drilling, the drill bit 22 passes through the first outer skin 14 of the entry material 10, through the first layer of lubricant/adhesive 18, through the cellulose core 20 (if present), through the second layer of lubricant/adhesive 16, and through the second outer skin 12 of the entry material 10. The drill bit 22 then passes through each of the circuit boards 30a, 30b, 30c, and 30d of the stack 28. The drill bit 22 then continues through hard outer skin 36 of the backup board 34, through the lubricant/adhesive layer 40, and into the wood core 44. After the drill bit 22 enters the wood core 44, the drill bit goes no further and momentarily dwells in the core 44 of the backup board 34. As the drill bit 22 passes through the lubricant/adhesive layers 16 and 18 of the entry material 10 and lubricant/adhesive layer 40 of the backup board 34, the drill bit picks up lubricant from the layer of lubricant/adhesive. The lubricant remains on the drill bit 22 and reduces the friction as the drill bit 22 drills the through-holes and as the drill bit is withdrawn from the through-holes.

Referring now to FIG. 5, another method in accordance with the present invention for drilling through-holes in printed circuit boards 30a, 30b, 30c, and 30d is schematically illustrated. A lubricating backup board such as the backup board 50 is placed on support surface 48. A stack 28 of circuit boards 30a, 30b, 30c, and 30d is placed on the lubricating, ventilated backup board 50 so that the bottom surface 46 of the stack 28 abuts the hard outer backup skin 60 of the backup board 50. It should be understood that the lubricating backup board 34 could be used instead of the lubricating backup board 50 as shown in FIG. 5.

A conventional entry material 68 may be placed on the top surface 32 of the stack 28 of circuit boards 30a, 30b, 30c, and 30d to be drilled. The conventional entry material may consist of a single ply of aluminum skin, or the conventional entry material 68 may consist of outer skins 70a and 70b bonded to a cellulose core 72 with laminating adhesive 70c and 70d. In any case, the conventional entry material 68 does not have lubricating properties. The top surface 32 of the stack 28 of circuit boards 30a, 30b, 30c, and 30d abuts against the hard outer skin 70b of the conventional entry material 68. The stack 28, of course, may include more or less printed circuit boards than the four illustrated in FIG. 5. The exaggerated spacing between the backup board 50, the circuit boards 30a, 30b, 30c, and 30d, and the entry material 68 is shown in FIG. 5 for purpose of clarity whereas in reality all of the components would be in tight, intimate contact with each other.

Once the backup board 50, the stack 28, and the entry material 68 have been positioned as shown in FIG. 5, the stack is then pressed down by a pressure foot 26 prior to drilling to assure that the stack is flat and secure when the drill bit 22 makes its initial contact with the entry material 68. During the drilling, the drill bit 22 passes through the entry material 68 and through each of the circuit boards 30a, 30b, 30c, and 30d of the stack 28. The drill bit 22 then continues through outer skin 60 of the backup board 50, through the lubricant/adhesive layer 64, through the metallic foil sheet 52, through the core laminating adhesive 58, and into the ventilated core member 56. After the drill bit 22 enters the ventilated core member 56, the drill bit goes no further and momentarily dwells in the core member 56 of the backup board 56. A supply of air flows through the core member 56 of the backup board 50. The supply of air removes cuttings and cools the drill bit 22.

As the drill bit 22 passes through the lubricant/adhesive layer 64 of the backup board 50, the drill bit picks up lubricant from the lubricant/adhesive layer. The lubricant remains on the drill bit 22 and reduces the friction as the drill bit 22 is withdrawn from the through-hole and remains on the drill bit 22 during the subsequent drilling of the next set of through-holes.

While the invention has been described and illustrated in detail, it is to be clearly understood that this is intended by way of illustration and example only and is not to be taken by way of limitation, the spirit and scope of this invention being limited only by the terms of the following claims.

What is claimed is:

1. A method for drilling a stack of printed circuit boards, the stack comprising one or more printed circuit boards and having a top surface and a bottom surface, the method comprising the steps of:

a. placing an entry material adjacent the top surface of the stack of printed circuit boards wherein the entry material comprises:
   i) a first hard outer entry skin placed adjacent the top surface of the stack of printed circuit boards;
   ii) a first entry lubricant/adhesive layer separated from the top surface of the stack of printed circuit boards by the first hard outer entry skin; and
   iii) a second hard outer entry skin laminated to the first hard outer entry skin by the first entry lubricant/adhesive layer to provide dimensional stability to the entry material;
b. placing a backup board adjacent the bottom surface of the stack of printed circuit boards wherein the backup board comprises:
   i) a first hard outer backup skin placed adjacent the bottom surface of the stack of printed circuit boards;
   ii) a first backup lubricant/adhesive layer separated from the bottom surface of the stack of printed circuit boards by the first hard outer backup skin; and
   iii) a backup board core, attached on its one side to the first hard outer backup skin by the first backup lubricant/adhesive layer, for supporting the first backup lubricant/adhesive layer and the first hard outer backup skin; and
c. drilling through the entry material, through the stack of printed circuit boards, and into the backup board.

2. The method of claim 1, wherein the first entry lubricant/adhesive layer and the first backup lubricant/adhesive layer are each a dry layer of a water dispersion of polyethylene oxide resin plasticized with a high molecular weight polyethylene glycol.

3. The method of claim 1, wherein the first and second hard outer entry skins are aluminum.

4. The method of claim 1, wherein the entry material further comprises a core positioned between the first entry lubricant/adhesive layer and the second hard outer entry skin, and a second entry lubricant/adhesive layer positioned between the core and the second hard outer entry skin.

5. The method of claim 4, wherein the second entry lubricant/adhesive layer is a dry layer of a water dispersion of polyethylene oxide resin plasticized with a high molecular weight polyethylene glycol.

6. The method of claim 4, wherein the core of the entry material is cellulose.

7. The method of claim 1, wherein the first hard outer backup skin is aluminum.

8. The method of claim 1, wherein the backup board further comprises a second hard outer backup skin laminated to the other side of the backup board core by a second backup lubricant/adhesive layer.

9. The method of claim 8, wherein the second hard outer backup skin is aluminum.

10. The method of claim 8, wherein the second backup lubricant/adhesive layer is a dry layer of a water dispersion of polyethylene oxide resin plasticized with a high molecular weight polyethylene glycol.

11. The method of claim 1, wherein the core of the backup board is wood.

12. The method of claim 1, wherein the core of the backup board is formed of a sinuous metal foil sandwiched between metal foil sheets.

13. A method for drilling a stack of printed circuit boards, comprising one or more printed circuit boards, and having a top surface and a bottom surface comprising the steps of:

a. placing an entry material adjacent the top surface of the stack of printed circuit boards;
b. placing a backup board adjacent the bottom surface of the stack of printed circuit boards wherein the backup board comprises:
   i) a first hard outer backup skin placed adjacent the bottom surface of the stack of printed circuit boards;
   ii) a first backup lubricant/adhesive layer separated from the bottom surface of the stack of printed circuit boards by the first hard outer backup skin; and
   iii) a backup board core for supporting the first backup lubricant/adhesive layer and the first hard outer backup skin; and
c. drilling through the entry material, the stack of printed circuit boards, and into the backup board.

14. The method of claim 13, wherein the first hard outer backup skin is aluminum.

15. The method of claim 13, wherein the backup board further comprises a second hard outer backup skin laminated to the other side of the backup board core by a second backup lubricant/adhesive layer.

16. The method of claim 15, wherein the second hard outer backup skin is aluminum.

17. The method of claim 15, wherein the second backup lubricant/adhesive layer is a dry layer of a water dispersion of polyethylene oxide resin plasticized with a high molecular weight polyethylene glycol.

18. The method of claim 13, wherein the core of the backup board is wood.

19. The method of claim 13, wherein the core of the backup board is formed of a sinuous metal foil sandwiched between metal foil sheets.

20. An entry material for use in drilling a stack of printed circuit boards comprising:
   a. first and second hard entry skins; and
   b. a first lubricant/adhesive layer sandwiched between the first and second hard entry skins.

21. The entry material of claim 20, wherein the first and second hard entry skins are aluminum.

22. The entry material of claim 20, wherein the first lubricant/adhesive layer is a dry layer of a water dispersion of polyethylene oxide resin plasticized with a high molecular weight polyethylene glycol.

23. The entry material of claim 20, wherein the entry material further comprises a core positioned between the first entry lubricant/adhesive layer and the second hard outer entry skin, and a second entry lubricant/adhesive layer positioned between the core and the second hard outer entry skin.

24. The entry material of claim 23, wherein the second lubricant/adhesive layer is a dry layer of a water dispersion of polyethylene oxide resin plasticized with a high molecular weight polyethylene glycol.

25. The entry material of claim 23, wherein the core of the entry material is cellulose.

26. A backup board for use in drilling a stack of printed circuit boards comprising:
   a. a first hard backup skin;
   b. a core; and
   c. a first lubricant/adhesive layer sandwiched between the first hard backup skin and the core.

27. The backup board of claim 26, wherein the first hard outer backup skin is aluminum.

28. The backup board of claim 26, wherein the first lubricant/adhesive layer is a dry layer of a water dispersion of polyethylene oxide resin plasticized with a high molecular weight polyethylene glycol.

29. The backup board of claim 26, wherein the core of the backup board is wood.

30. The backup board of claim 26, wherein the core of the backup board is formed of a sinuous metal foil sandwiched between metal foil sheets.

31. The backup board of claim 26, wherein the backup board further comprises a second hard outer backup skin laminated to the other side of the backup board core by a second backup lubricant/adhesive layer.

32. The backup board of claim 31, wherein the second hard outer backup skin is aluminum.

33. The backup board of claim 31, wherein the second backup lubricant/adhesive layer is a dry layer of a water dispersion of polyethylene oxide resin plasticized with a high molecular weight polyethylene glycol.

* * * * *